United States Patent [19]

Béal et al.

[11] Patent Number: 4,562,417
[45] Date of Patent: Dec. 31, 1985

[54] TRANSVERSE CHARGE TRANSFER FILTER

[75] Inventors: Gérard Béal; Jean-Louis Coutures, both of Paris, France

[73] Assignee: Thomson-CSF, Paris, France

[21] Appl. No.: 485,214

[22] Filed: Apr. 15, 1983

[30] Foreign Application Priority Data

Apr. 23, 1982 [FR] France .................. 82 07062

[51] Int. Cl.[4] .................. H03H 9/70; H01L 29/78
[52] U.S. Cl. .................. 333/165; 333/166; 377/61
[58] Field of Search .................. 333/165, 166; 377/58, 377/61-63; 357/24; 364/824, 825, 844, 862

[56] References Cited

U.S. PATENT DOCUMENTS

| 3,965,462 | 6/1976 | Belt .................. 357/24 |
| 3,999,152 | 12/1976 | Sato et al. .................. 333/165 |
| 4,446,473 | 5/1984 | Pendleton .................. 357/24 |

FOREIGN PATENT DOCUMENTS

| 2833387 | 2/1980 | Fed. Rep. of Germany ...... 333/165 |
| 2271716 | 12/1975 | France . |
| 2453543 | 10/1980 | France . |
| 1529112 | 10/1978 | United Kingdom ................ 333/165 |

OTHER PUBLICATIONS

"Radio Shack Dictionary of Electronics" (Graf, Editor), 1974–1975; pp. 358-359.
"Integrated Circuits", Warner et al., McGraw-Hill Book Company, New York, © 1965; pp. 252-253.

Primary Examiner—Marvin L. Nussbaum
Attorney, Agent, or Firm—Roland Plottel

[57] ABSTRACT

In this transverse charge transfer filter having N MOS capacitors arranged on the same semiconductor substrate and provided with electrodes, the electrode of every other MOS capacitor has its ends covered by the ends of the electrodes of two adjacent MOS capacitors, the N MOS capacitors being arranged in n rows and the charge transfer direction in two adjacent rows being opposite, which makes it possible to compensate for the effects of the displacements of the masks used for manufacturing the transverse charge transfer filters.

13 Claims, 5 Drawing Figures

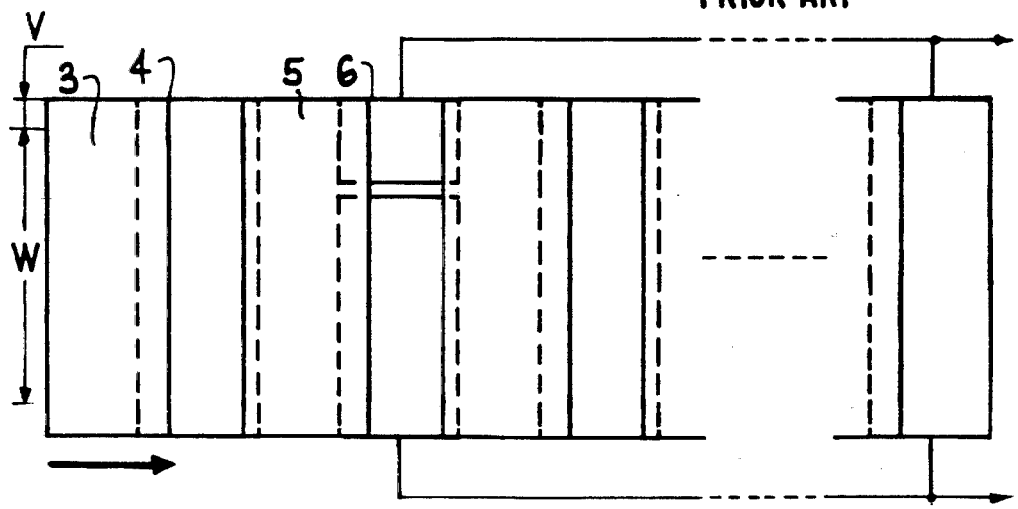
FIG_1 PRIOR ART
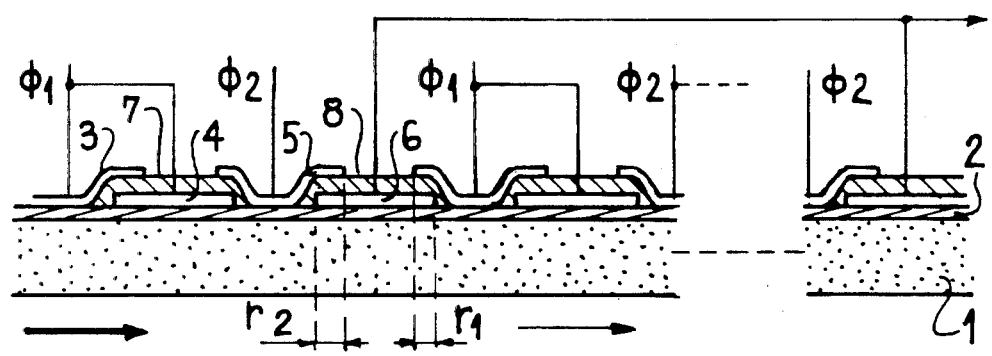
FIG_2 PRIOR ART
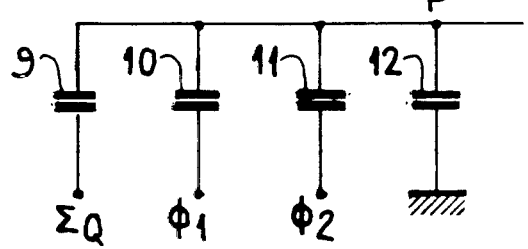
FIG_3 PRIOR ART

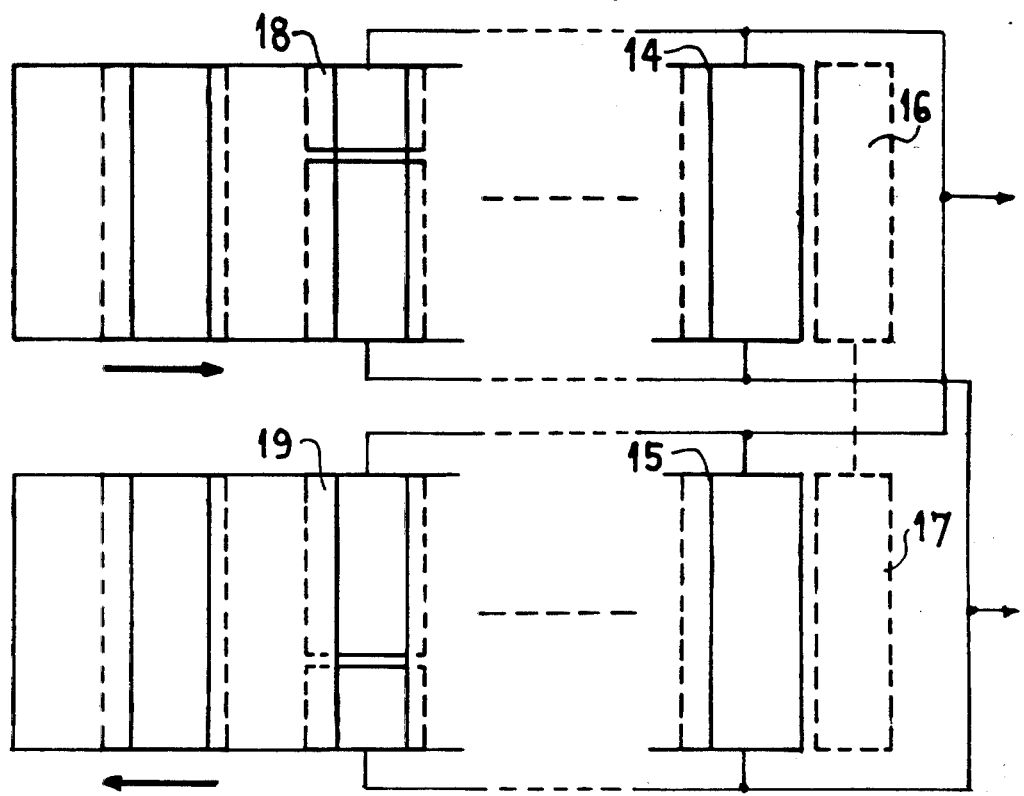
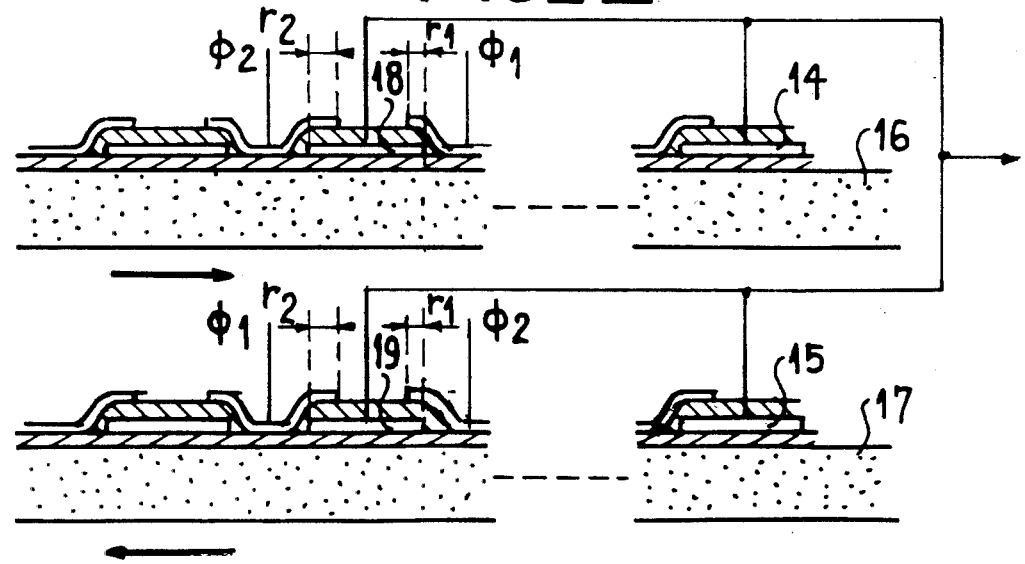

TRANSVERSE CHARGE TRANSFER FILTER

BACKGROUND OF THE INVENTION

The present invention relates to a transverse charge transfer filter.

The expression elementary transverse charge transfer filter means a system of delay stages to whose input is applied the signal to be filtered, the filtered signal being obtained by forming the sum of all the output signals of the different delay stages, multiplied by the weight factors.

A complex transverse charge transfer filter is understood to mean a group of elementary transverse charge transfer filters to whose input are applied different signals to be filtered, the filtered signal being obtained by forming the sum of the output signals of all the delay stages of the different elementary filters.

Hereinafter, the term filter will apply either to an elementary filter or to a complex filter.

Each delay stage is obtained by means of a group of MOS (Meta Oxide Semiconductor) capacitors arranged in an adjacent manner on the same semiconductor substrate, one of the capacitors being provided with an electrode responsible for reading the the charge, whilst the other capacitors are provided with electrodes responsible for controlling the charge transfer. The number of MOS capacitors used for controlling the charge transfer varies essentially with the technology of the filter and with the number of control phases used.

To avoid any break in the charge transfer between the different stages and, within each stage, between the different MOS capacitors thereof, any gaps in the arrangement of successive electrodes must be avoided. For this purpose, it is known to overlap the ends of adjacent electrodes, an insulator then being provided to prevent any contact between the electrodes in the overlap area. The overlapping of a reading electrode by two adjacent control electrodes causes a variation in the reading of the charge quantity located beneath said reading electrode.

Thus, no matter what the reading method used (reading in current with fixed voltage reading electrode or reading in voltage with floating reading electrode) and no matter what the number of control electrodes per delay stage, a variation in potential must be produced during the reading operation, on at least one of the two control electrodes surrounding the reading electrode in question, so as to ensure the charge transfer beneath said reading electrode. This variation in potential is transmitted to the reading electrode via the capacitor formed by the end of the reading electrode and the control electrode which overlap and by the insulating layer inserted between these ends.

This variation in to the reading leads to the addition of a d.c. component bias to the a.c. component resulting from the actual reading of the charge located beneath the reading electrode in question. The value of this d.c. component is dependent on the widths of the overlaps (considered in the longitudinal direction of the filter) on the reading electrode in question by adjacent control electrodes, on which control electrodes the variations in potential occur during reading. The different reading electrodes of the filter are interconnected, so that the variations corresponding to these different reading electrodes are summed.

During the manufacture of a filter, the overlap widths between electrodes are fixed for all the electrodes of the filter by the positioning, with respect to the electrodes whose ends are to be overlapped, of a mask, whose non-recessed portions serve to preserve the parts which are not to be overlapped.

A problem then occurs as a result of the fact that the positioning of the mask can vary from one filter to the next, which filters otherwise have identical constructional characteristics. Thus, if the positioning of the mask varies, the d.c. reading component also varies. However, for facilitating the acquisition of the reading signal, it is advantageous to have the same d.c. reading component among the individual filters. This applies more particularly as a result of the fact that a small variation in the positioning of the mask leads to a relatively large variation of the d.c. component.

SUMMARY OF THE INVENTION

The object of the invention is to solve this problem.

According to the invention, the transverse charge transfer filter has N MOS capacitors disposed on the same semiconductor substrate and divided up into delay stages, the MOS capacitors of each delay stage being provided in one case with a reading electrode, whilst the others are provided with control electrodes, every other electrode having its ends covered by the ends of two adjacent electrodes, said filter being such that the N MOS capacitors are arranged in n rows (with n being even) numbered from 1 to n, at a rate of N/n MOS capacitors per row, the charge transfer directions in two adjacent rows being opposite, which makes it possible to compensate for effects of displacements of the masks used for the manufacture of the transverse charge transfer filters.

BRIEF DESCRIPTION OF THE DRAWINGS

FIG. 1 is a diagrammatic plan view of a prior art transverse charge transfer filter;

FIG. 2 is a longitudinal section of the filter of FIG. 1;

FIG. 3 is an equivalent circuit diagram of the filter of FIGS. 1 and 2;

FIG. 4 is a diagrammatic plan view of a transverse charge transfer filter according to the invention; and FIG. 5 illustrates longitudinal sections of different rows forming the filter of FIG. 4.

DETAILED DESCRIPTION OF THE INVENTION

The preferred embodiment hereinafter described relates to a so-called implantation asymmetry technology (these asymmetries not being shown in the drawings) for two control phases and for single gap reading electrodes. However, it is stressed that the principle of the invention is also applicable to the so-called excess oxide thickness technology, with a random number of control phases and with double gap reading electrodes.

FIGS. 1 and 2 show a prior art transverse charge transfer filter, which is e.g. an elementary filter. This filter has N MOS capacitors arranged adjacently on the same semiconductor substrate 1 covered by an oxide layer 2.

These N MOS capacitors are distributed into delay stages, each delay stage having, e.g. in the manner shown in FIGS. 1 and 2, one MOS capacitor provided with a reading electrode and three MOS capacitors provided with a control electrode. If M is the number of MOS capacitors per delay stage, the filter has N/M delay stages. In this case, the filter has N/4 identical delay stages, of which the first is shown in its entirety in FIGS. 1 and 2 and is described hereinafter.

Following the charge transfer direction indicated by the left-to-right arrow in FIGS. 1 and 2, the first stage comprises a first MOS capacitor provided with a control electrode 3, called the transfer electrode, a second MOS capacitor provided with a control electrode 4, called the storage electrode, a third MOS capacitor provided with a control electrode 5, also called transfer electrode, and a fourth MOS capacitor provided with a reading electrode 6. Outside the periods reserved for reading, the reading electrode also fulfils the function of a storage electrode, as a result of an appropriate connection (not shown).

A periodic potential $\phi_1$ is applied to the transfer and storage electrodes 3, 4. A periodic potential $\phi_2$ is applied to the transfer electrode 5.

As shown in FIG. 1, a gap is made in each reading electrode at suitable levels in each case, the upper and lower reading electrode portions being respectively interconnected. This makes it possible to carry out a summation of the charges present at the same time in the different delay stages, respectively multiplied by weight factors determined by the position of the different gaps.

The ends of every other electrode are covered by the ends of adjacent electrodes. Thus, in the example of FIGS. 1 and 2, the ends of storage electrode 4 are covered by the right end of transfer electrode 3 and the left end of transfer electrode 5. In the same way, the ends of reading electrode 6 are covered by the right end of transfer electrode 5 and the left end of the first transfer electrode of the second delay stage.

An insulating oxide layer 7 is provided between storage electrode 4 and the curved ends of the electrodes adjacent thereto. In the same way, an insulating oxide layer 8 is provided between reading electrode 6 and the curved ends of the electrodes adjacent thereto.

During the manufacture of such a filter, when carrying out the deposition of the final metal layer corresponding to electrodes, such as electrodes 3 and 5 for the first delay stage, it is necessary to use a mask for preserving the parts of the insulating oxide layers, such as layers 7 and 8 for the first delay stage, which are not to be covered by the final metal layer. The positioning of this mask determines the overlap widths (taken in the longitudinal direction) of one electrode by the electrodes adjacent thereto.

Thus, the positioning of the mask used for the manufacture of the filter shown in FIGS. 1 and 2 has determined an overlap width $r_2$ for the left ends of all the overlapped electrodes (such as electrodes 4 and 6 for the first delay stage) and an overlap width $r_1$ for the right ends of said electrodes. The influence of this overlap on the reading will now be explained relative to FIG. 3, which shows the equivalent circuit diagram of the filter.

On this diagram is shown a point P, which is the common point to the group of upper or lower portions of the reading electrodes of the filter, the overlap influence on the reading being the same in both cases. This point P is connected to a first terminal of four capacitors 9, 10, 11 and 12.

Capacitor 9 is provided with a second terminal receiving the sum $\Sigma Q$ of the charges present beneath the different reading electrodes of the filter. Capacitor 9 has a capacitance $C_{ox}$ equal to the insulating oxide capacitance of the reading electrodes relative to the charge transfer channel.

Capacitor 10 is provided with a second terminal receiving the potential $\phi_1$ and has a capacitance $\Sigma C_{r1}$ equal to the sum of the overlap capacitances $C_{41}$ of adjacent control electrodes, to which is applied potential $\phi_1$.

Capacitor 11 is provided with a second terminal receiving potential $\phi_2$ and has a capacitance $\Sigma C_{r2}$ equal to the sum of the overlap capacitances $C_{r2}$ of the reading electrodes by adjacent control electrodes to which is applied potential $\phi_2$.

Capacitor 12 is provided with a second terminal connected to ground and has a capacitance $C_p$ equal to the sum of the constant stray capacitances due to phenomena other than the overlaps.

During the reading of all the charges, at point P, in the case of voltage reading, there is a potential variation which can be expressed in the following way:

$$V_P = \frac{\Sigma Q}{C_P + \Sigma C_{r1} + \Sigma C_{r2}} + \frac{\Sigma C_{r1}}{C_P + \Sigma C_{r1} + \Sigma C_{r2}} \Delta \phi_1 + \frac{\Sigma C_{r2}}{C_P + \Sigma C_{r1} + \Sigma C_{r2}} \Delta \phi_2$$

In the case of current reading, there is a charge variaton expressed in the following way:

$$Q_P = \Sigma Q + \Sigma C_{r1} \Delta \phi_1 + \Sigma C_{r2} \Delta \phi_2$$

In these two expressions, $\Delta\phi_1$ and $\Delta\phi_2$ represent the potential variations of $\phi_1$ and $\phi_2$ during charge reading. For example, in the case of two control phases, $\Delta\phi_1$ and $\Delta\phi_2$ have opposite signs and, in the case of a control phase, $\Delta\phi_2$ is zero.

The overlap capacitances $\Sigma C_{r1}$ and $\Sigma C_{r2}$ are a function of the number of delay stages N/M of the filter.

In the case of a filter with a single reading electrode gap, we obtain:

$$\Sigma C_{r1} = \gamma_{r1} \frac{W}{2} \left[ \frac{N}{M} + \delta \sum_{i=1}^{N/M} h_i \right] + \delta_{r1} \frac{N}{M} V$$

$$\Sigma C_{r2} = \gamma_{r2} \frac{W}{2} \left[ \frac{N}{M} + \delta \sum_{i=1}^{N/M} h_i \right] + \delta_{r2} \frac{N}{M} V$$

In these two expressions, $\gamma$ is a constant term equal to $\epsilon/e$, in which $\epsilon$ is the dielectric constant of the insulating oxide layers such as 7 and 8 for the first delay stage and e is the thickness of these layers. W is the width (considered in the transverse direction) of the charge transfer channel, as shown in FIG. 1 is also a constant term equal to $1 - (2 g/W)$, in which g is the guard of the gaps on the edge of the channel for factors equal to $+1$ or to $-1$. V stands for the width (taken in the transverse direction) of the projection of the electrodes with respect to the channel.

$$\sum_{i=1}^{N/M} h_i$$

represents the sum of the weight factors corresponding to the different reading electrodes, i being a symbol varying from 1 to N/M, in which N/M is the number of delay stages of the filter.

The term:

$$\frac{\Sigma C_{r1} \Delta \phi_1}{C_P + \Sigma C_{r1} + \Sigma C_{r2}} + \frac{\Sigma C_{r2} \Delta \phi_2}{C_P + \Sigma C_{r1} + \Sigma C_{r2}}$$

in the expression of the variation of voltage $V_P$ at point P, or $\Sigma C_{r1}\Delta\phi_1 + \Sigma C_{r2}\Delta\phi_2$ in the expression of the variation of the charge $Q_P$ at point P, corresponds to a d.c. component, which is added to the a.c. component $$\frac{\Sigma Q}{C_P + \Sigma C_{r1} + \Sigma C_{r2}} \text{ or } \Sigma Q$$

Thus, this d.c. component is a function of the overlap widths $r_1$ and $r_2$, which are themselves determined by the positioning of the mask. However, the positioning of the mask can vary between individual filters, which otherwise have identical constructional characteristics.

In the case of a prior art filter, the d.c. component is consequently liable to vary within relatively significant proportions between individual filters, which is prejudicial to the acquisition of the reading signals.

The filter according to the invention makes it possible to obtain a substantially constant d.c. component between the individual filters.

FIGS. 4 and 5 show an embodiment of a filter according to the invention. The N MOS capacitors of the filter according to the invention are arranged in n rows of N/n capacitors each.

For reasons of clarity, only two rows are shown in FIGS. 4 and 5. These rows represent either two consecutive elementary filters, not arranged in rows, of the same complex filter, or two adjacent rows of the same elementary filter, or the last and first rows of two consecutive elementary filters forming part of the same complex filter.

The N/n MOS capacitors of each row are numbered 1 to N/n following the charge transfer direction chosen for the first row (e.g. from left to right, as shown by an arrow beneath the first row).

In the case of two adjacent rows of the same elementary filter, the continuity between the Nth/n MOS capacitor of the first row, which is provided with an electrode 14, and the Nth/n MOS capacitor of the second row provided with an electrode 15, is ensured by first and second diodes 16, 17 located respectively in the semiconductor substrate of the first and second rows and which are interconnected. The nature of the electrodes 14, 15 is such that they are not reading electrodes and that on the path taken by the charges between the final reading electrode in one row and the first reading electrode in the following row, there are three electrodes, like electrodes 3, 4 and 5 of FIGS. 1 and 2, i.e. a transfer electrode, a storage electrode and a transfer electrode. Moreover, by an adequate control of the control electrodes, the charge transfer direction in the second row is reversed compared with that of the first row (as shown by the arrows in FIGS. 4 and 5).

More generally, for n adjacent rows of the same elementary filter (with n being even), the Nth/n MOS capacitor of each row having an odd number is connected, via diodes, to the Nth/n MOS capacitor of the following row and the first MOS capacitor of each row with an even number is converted to the first MOS capacitor of the following row. Moreover, by a suitable control of the control electrodes, the charge transfer directions in two adjacent rows are opposite.

In the case of a complex filter, the signals to be filtered are introduced, and the control electrodes controlled, in such a way that the charge transfer directions in two adjacent rows are opposite. In the case where the elementary filters of the same complex filter are not disposed in rows, the fact, that the signals to be filtered are introduced in such a way that the charge transfer directions in two adjacent rows are opposite, leads to the input stages of two adjacent rows being located at opposite ends of these two rows. It is pointed out that the input stages serve to carry out the conversion of the input signals into charges.

Moreover, in the case where the elementary filters of the same complex filter are not disposed in rows, there is no connection between the different rows, which then represent the different elementary filters. It is for this reason that diodes 16, 17 and the connections between them have only been shown in dotted lines on FIG. 4.

In the case where the elementary filters of the same complex filter are arranged in rows, the final row of each elementary filter is not connected to the first row of the following elementary filter. The upper portions of the reading electrodes of the different rows constituting the filter are interconnected and this also applies to the lower portions of these electrodes. The ends of the electrodes belonging to MOS capacitors of the same number on different rows may or may not be aligned.

All the reading electrodes of all the rows of the filter have the same overlap width $r_1$ of their right end and the same overlap width $r_2$ of their left end. However, unlike the filter shown in FIGS. 1 and 2, the potential applied to the control electrodes, whose end covers the left end of the reading electrodes, is not always equal to $\phi_2$, but as a result of the reversal of the charge transfer direction between individual rows, is alternately equal to $\phi_2$ and to $\phi_1$. In the same way, contrary to the filter shown in FIGS. 1 and 2, the potential applied to the control electrodes, whose end covers the right end of the reading electrodes, is not always equal to $\phi_1$, but as a result of the reversal of the charge transfer direction between individual rows, is alternately equal to $\phi_1$ and to $\phi_2$. This is demonstrated in FIG. 5 for two reading electrodes 18, 19 belonging to two adjacent rows.

On referring to the equations written during the study of a prior art filter, in the expressions $\Sigma C_{r1}\Delta\phi_1$ and $\Sigma C_{r2}\Delta\phi_2$, the terms $\Sigma C_{r1}$ and $\Sigma C_{r2}$ can be put into the form:

$$\Sigma C_{r1} = \Sigma C_{r11} + \Sigma C_{r12}$$

$$\Sigma C_{r2} = \Sigma C_{r21} + \Sigma C_{r22}$$

in which $\Sigma C_{r11}$ represents the sum of the capacitances due to the overlap of the right ends of the reading electrodes by control electrodes to which is applied the potential $\phi_1$, $\Sigma C_{r12}$ the sum of the capacitances due to the overlap of the left ends of reading electrodes by the control electrodes, to which is applied the potential $\phi_1$, $\Sigma C_{r21}$ the sum of the capacitances due to the overlap of the right ends of reading electrodes by control electrodes, to which is applied the potential $\phi_2$ and $\Sigma C_{222}$ the sum of the capacitances due to the overlap of the left ends of the reading electrodes by control electrodes, to which is applied the potential $\phi_2$.

If it is now noted that the overlap widths $r_1$ and $r_2$ can be respectively written $r+d$ and $r-d$, in which d designates the de-positioning or displacement of the overlap mask edges at the two ends of a reading electrode overlapped by two adjacent control electrodes and r is the average overlap width at the two ends of said reading electrode, it is possible to write with the same notations as hereinbefore and for the case in which n is equal to 2

$$\Sigma C_{r11} = \left[ \gamma \frac{W}{2} \left( \frac{N}{2M} + \delta \sum_{i=1}^{N/2M} h_i \right) + \delta \frac{N}{2M} V \right] [r + d]$$

$$\Sigma C_{r12} = \left[ \gamma \frac{W}{2} \left( \frac{N}{2M} + \delta \sum_{i=N/2M+1}^{N/M} h_i \right) + \delta \frac{N}{2M} V \right] [r - d]$$

$$\Sigma C_{r21} = \left[ \gamma \frac{W}{2} \left( \frac{N}{2M} + \delta \sum_{N/2M+1}^{N/M} h_i \right) + \delta \frac{N}{2M} V \right] [r + d]$$

$$\Sigma C_{r22} = \left[ \gamma \frac{W}{2} \left( \frac{N}{2M} + \delta \sum_{i=1}^{N/2M} h_i \right) + \delta \frac{N}{2M} V \right] [r - d]$$

$\sum_{i=1}^{N/2M} h_i$ and $\sum_{i=N/2M+1}^{N/M} h_i$ respectively representing the sum of the weight factors encountered on the first and second rows. It can be stated with a good approximation that the sum of the factors encountered on the first row is equal to the sum of the factors encountered on the second row, which increasingly applies as the number N/M of factors becomes larger.

The difference between $\sum_{i=1}^{N/2M} h_i$ and $\sum_{i=N/2M+1}^{N/M} h_i$ is therefore negligible compared with N/M and it is possible to write:

$$\Sigma C_{r1} = \Sigma C_{r2} = \gamma r \frac{N}{M} \left( \frac{W}{2} + V \right) = \text{constant}$$

The terms $\gamma$, N/M, W/2 and v are invariant constants between individual filters. The term r is also invariable between individual filters because, during the manufacture of these filters, the de-positioning or displacement of the mask between individual filters leads to a variation in parameter d and not a variation in parameter r.

Thus, terms $\Sigma C_{r1}$ and $\Sigma C_{r2}$ are substantially constant, which implies that the d.c. reading component is substantially invariant between indivdual filters, which leads to the desired effect. The same conclusion is reached for a number of rows which is a multiple of 2.

In order to improve the performance of the filter according to the invention, the number of rows of an elementary filter must not be chosen in a random manner but, as has been shown hereinbefore, in such a way as to obtain the result that the sum of the weight factors of the even number rows and the sum of the weight factors of the odd number rows compensate or balance each other.

What is claimed is:

1. A transverse charge transfer filter having N MOS capacitors, each including a selected one of a reading electrode (6,18,19), having a gap therein, and a control electrode (3,4,5,14,15), disposed on the same semiconductor substrate (1) and distributed into delay stages,
   each delay stage being defined by one MOS capacitor provided with a reading electrode (6,18,19) and a plurality of MOS capacitors each provided with a control electrode, said reading electrode (6, 18, 19) and control electrodes (3,4,5,14,15) being arranged as a series of partially overlapping (r1,r2) adjacent electrodes,
   each of said control electrode (3,4,5,14,15) serving as a selected one of a transfer (3,5) electrode and a storage (4,14,15) electrode and each of said reading electrodes (6,18,19) serving as a storage electrode outside of time periods reserved for reading, said transfer electrodes (3,5) and said storage electrodes (4,6) being separated from each other by an insulating oxide layer (7,8) and arranged to alternate in said series,
   whereby, in each delay stage, the ends of alternate electrodes are covered (r1,r2) by the ends of two adjacent electrodes,
   wherein the N MOS capacitors are arranged in n rows, with n even, numbered from 1 to n, at the rate of N/n MOS capacitors per row, the MOS capacitors of each row being numbered from 1 to N/N in ascending order along the direction defined by the charge transfer direction in row number 1, and
   wherein the transfer direction in two adjacent rows is opposite, which makes it possible to compensate for the effects resulting from displacements of the mask used to carry out the deposition simultaneously of the electrodes of the transverse charge transfer filter, the ends of which are covering the ends of two adjacent electrodes.

2. A filter according to claim 1, wherein the Nth/n MOS capacitor of each odd number row is connected to the Nth/n MOS capacitor of the following row, and wherein the first MOS capacitor of each even number row is connected to the first MOS capacitor of the following row.

3. A filter according to claim 1, wherein the N/n MOS capacitors of each row are in turn arranged in m subrows, numbered 1 to m, the MOS capacitors of each subrow being numbered from 1 to N/m n by following the charge transfer direction in subrow number 1, the Nth/m n MOS capacitor of the following subrow, the first MOS capacitor of each even number subrow being connected to the first MOS capacitor of the following subrow, and the charge transfer directions in two adjacent subrows being opposite.

4. A filter according to claim 2, wherein the connections between the MOS capacitors located at the ends of adjacent rows take place by means of interconnected diodes.

5. A filter according to claim 3, wherein the connections between MOS capacitors located at the ends of adjacent subrows are obtained by means of interconnected diodes.

6. A filter according to claim 1, wherein the input stages of two adjacent rows are located at opposite ends of these two rows.

7. A filter according to claim 1, wherein the ends of electrodes belonging to the MOS capacitors of the same number on different rows are aligned.

8. An integrated circuit transverse charge transfer filter construction which assures uniform reading characteristics among different individual filters, despite variation among filters in the respective alignments of a mask used in producing the respective individual filters, wherein, in accordance with the invention, each filter comprises a number N of Metal-Oxide-Semiconductor (MOS) capacitor electrodes (3,4,5,6,14,15,18,19) disposed on an insulating oxide layer (2) on the same semiconductor substrate (1) and forming with said oxide layer (2) and said substrate (1) a number N of MOS Capacitors, distributed into delay stage rows;

each delay stage row being defined by one MOS capacitor provided with a reading electrode (6,18,19) and a plurality of MOS capacitors each provided with a control electrode, said reading electrode (6, 18, 19) and control electrodes (3,4,5,14,15) being arranged as a series of partially overlapping (r1,r2) adjacent electrodes, the capacitor electrodes (3, 4, 5, 6) of each delay stage are arranged in sequence, along a charge transfer axis of said delay stage, and each electrode has two ends along said axis;

a first plurality (4, 6, 14, 5, 19) of said electrodes are disposed at regular intervals on said substrate (1) and covered by at least one layer of insulating material (7, 8) and a second plurality of electrodes (3, 5), alternating with said first plurality of electrodes along said axis, are deposited on top of said insulating material (7, 8) in such a manner that the ends of each of said first plurality of electrodes are overlapped by the ends of two of said second plurality of electrodes, the relative widths of the two overlaps on each overlapped electrode being determined by the alignment of the mask used in depositing said second plurality of electrodes, with a displacement d of said mask, and hence of centerlines of said second plurality of electrodes, with respect to centerlines of intervals between said first plurality of electrodes, resulting in unequal widths of said two overlaps and a d.c. reading component bias to readings by electrodes of said delay stage;

the nunber n of rows of said N capacitors is selected to be even, with the rows numbered from 1 to n, and N/n capacitors in each row, the capacitors of each row being numbered from 1 to N/n in ascending order along the direction defined by the charge transfer direction in row number 1; and the charge transfer directions of the rows are selected to alternate, thereby causing any d.c. reading component biases in the readings of the even rows of capacitors to be equal, opposite, and compensating to any d.c. reading component biases of the readings of the odd rows of capacitors, and the net effect of differing mask displacements d among filters to be zero.

9. Filter construction as defined in claim 8, wherein each delay stage includes at least one reading electrode (18, 19) which is one of said first plurality of electrodes.

10. Filter construction as defined in claim 9, wherein (FIG. 1) each reading electrode (18, 19) is formed with a gap transverse to said charge transfer direction and defining separate upper and lower reading electrode portions.

11. Filter construction as defined in claim 10, wherein the upper portions of the reading electrodes of the different delay stages are interconnected and the lower portions of the reading electrodes of the different delay stages are interconnected, in order to carry out a summation of the charges present at the same time in the different delay stages.

12. Filter construction as defined in claim 11, wherein the respective gaps in different reading electrodes (18, 19) are formed at different transverse positions in the respective delay stages.

13. Filter construction as defined in claim 8, wherein said second plurality of electrodes (3, 5) act as control electrodes and have a saucer-shaped cross-section.

* * * * *